(12) United States Patent
Cheng et al.

(10) Patent No.: US 10,084,041 B2
(45) Date of Patent: Sep. 25, 2018

(54) METHOD AND STRUCTURE FOR IMPROVING FINFET WITH EPITAXY SOURCE/DRAIN

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/688,224

(22) Filed: Aug. 28, 2017

(65) Prior Publication Data

US 2017/0358643 A1     Dec. 14, 2017

Related U.S. Application Data

(62) Division of application No. 15/074,587, filed on Mar. 18, 2016, now Pat. No. 9,831,241, which is a division (Continued)

(51) Int. Cl.
| | |
|---|---|
| *H01L 29/66* | (2006.01) |
| *H01L 29/06* | (2006.01) |
| *H01L 21/3213* | (2006.01) |
| *H01L 21/762* | (2006.01) |

(Continued)

(52) U.S. Cl.
CPC .... *H01L 29/0653* (2013.01); *H01L 21/32139* (2013.01); *H01L 21/76224* (2013.01);

(Continued)

(58) Field of Classification Search
CPC ..... H01L 21/823425; H01L 21/823814; H01L 21/845

(Continued)

(56) References Cited

U.S. PATENT DOCUMENTS

| | | |
|---|---|---|
| 6,492,282 B1 | 12/2002 | Tobben et al. |
| 6,706,600 B2 | 3/2004 | Kanaya |

(Continued)

FOREIGN PATENT DOCUMENTS

| | | |
|---|---|---|
| KR | 10-0230396 B1 | 11/1999 |
| KR | 10-2001-0077195 A | 8/2001 |

(Continued)

OTHER PUBLICATIONS

List of IBM Patents or Patent Applications Treated as Related, dated Aug. 28, 2017, 2 pages.

*Primary Examiner* — Tan N Tran
(74) *Attorney, Agent, or Firm* — Scully, Scott, Murphy & Presser, P.C.; Daniel P. Morris, Esq.

(57) ABSTRACT

Isolation structures are formed to laterally surround a gate material block such that each sidewall of the gate material block abuts a corresponding sidewall of the isolation structures. Sidewalls of the gate material bock define ends of gate structures to be subsequently formed. The isolation structures obstruct lateral growth of a semiconductor material during a selective epitaxial grown process in formation of source/drain regions, thereby preventing merging of the source/drain regions at the ends of gate structures. As a result, a lateral distance between each sidewall of the gate material block and a corresponding outermost sidewall of an array of a plurality of semiconductor fins can be made sufficiently small without causing the electrical shorts of the source/drain regions.

18 Claims, 11 Drawing Sheets

Related U.S. Application Data of application No. 14/502,270, filed on Sep. 30, 2014, now Pat. No. 9,293,459.

(51) Int. Cl.
*H01L 21/8234* (2006.01)
*H01L 27/088* (2006.01)
*H01L 29/417* (2006.01)
*H01L 29/78* (2006.01)

(52) U.S. Cl.
CPC ........... *H01L 21/823431* (2013.01); *H01L 21/823437* (2013.01); *H01L 21/823481* (2013.01); *H01L 27/0886* (2013.01); *H01L 29/0649* (2013.01); *H01L 29/41791* (2013.01); *H01L 29/6681* (2013.01); *H01L 29/66553* (2013.01); *H01L 29/66795* (2013.01); *H01L 29/785* (2013.01)

(58) Field of Classification Search
USPC .................................. 257/192, 213, 288, 401
See application file for complete search history.

(56) References Cited

U.S. PATENT DOCUMENTS

| | | | |
|---|---|---|---|
| 8,492,830 B2 | 7/2013 | Kajiyama | |
| 9,034,700 B1 | 5/2015 | Jeong et al. | |
| 9,087,858 B2 | 7/2015 | Yoo et al. | |
| 9,620,642 B2 * | 4/2017 | Toh | H01L 29/785 |
| 2004/0266120 A1 | 12/2004 | Hareland et al. | |
| 2008/0096364 A1 | 4/2008 | Wilson et al. | |
| 2015/0102426 A1 * | 4/2015 | Flachowsky | H01L 29/785 257/401 |
| 2015/0303305 A1 | 10/2015 | Ching et al. | |

FOREIGN PATENT DOCUMENTS

| | | |
|---|---|---|
| KR | 10-2005-0069082 A | 7/2005 |
| KR | 10-2005-0073054 A | 7/2005 |
| KR | 10-0600288 B1 | 7/2006 |
| KR | 10-0723524 B1 | 5/2007 |
| KR | 10-2009-0132784 A | 12/2009 |

* cited by examiner

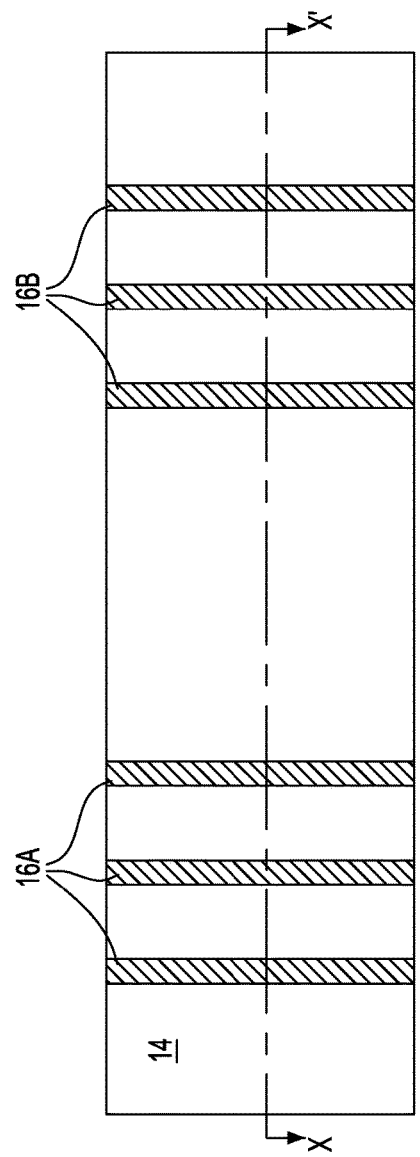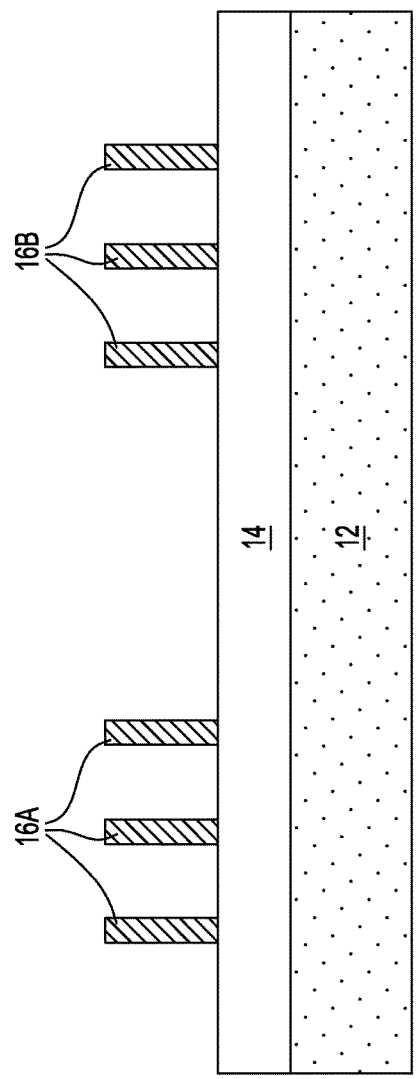

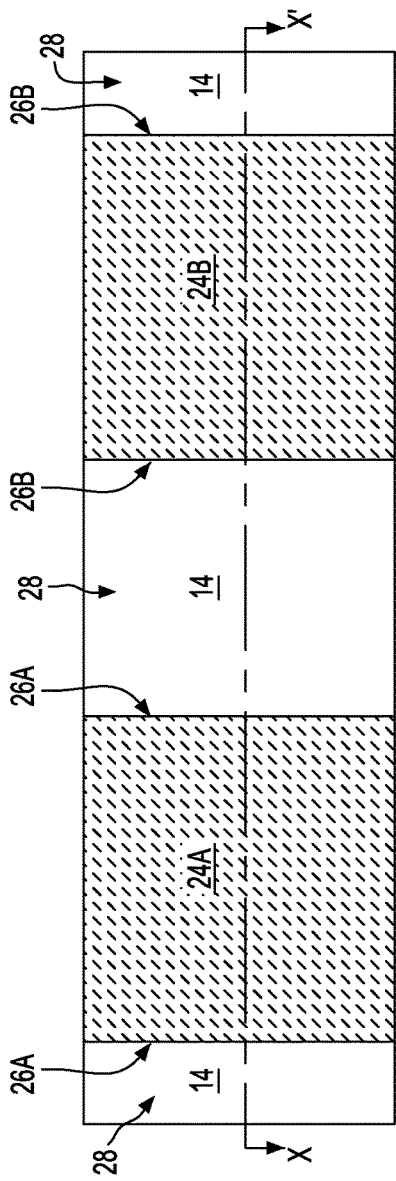
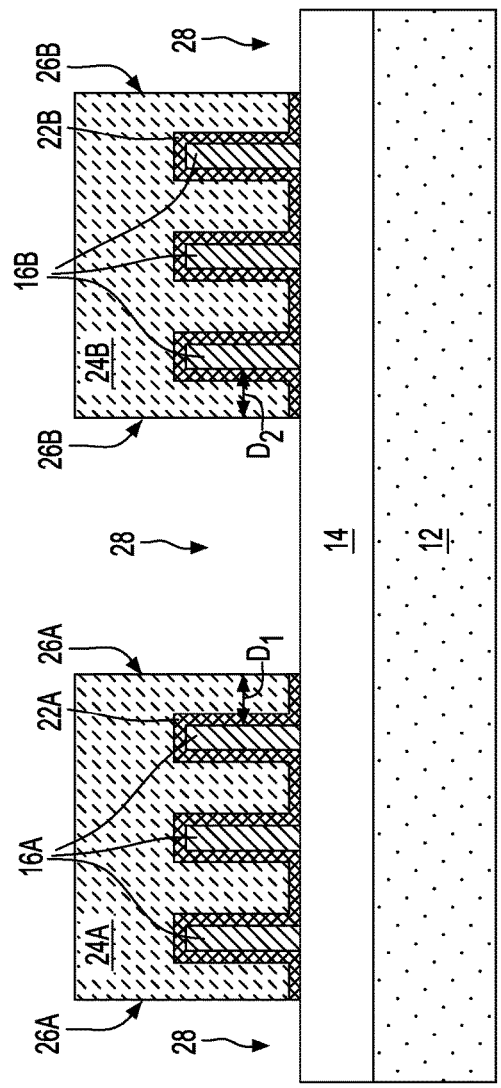
FIG. 3A
FIG. 3B

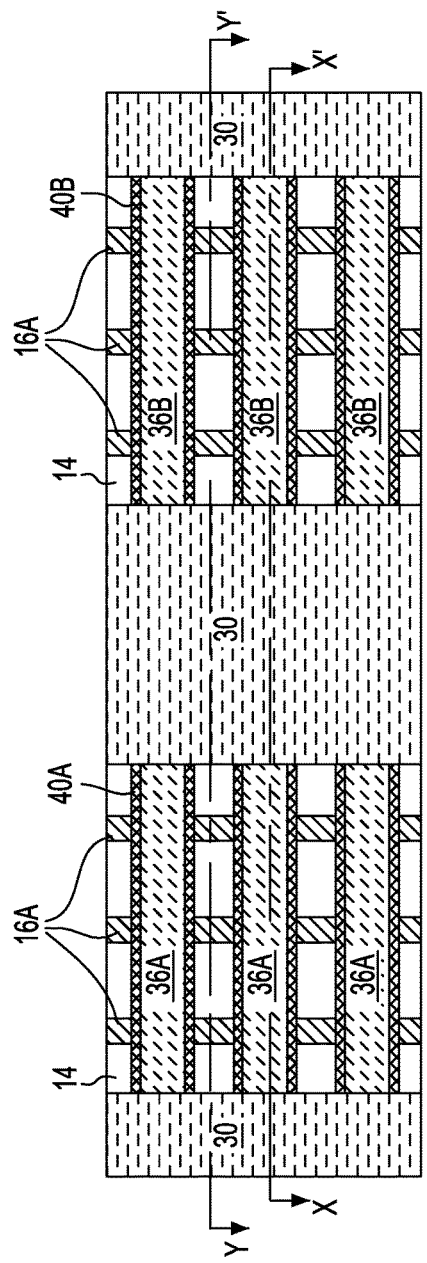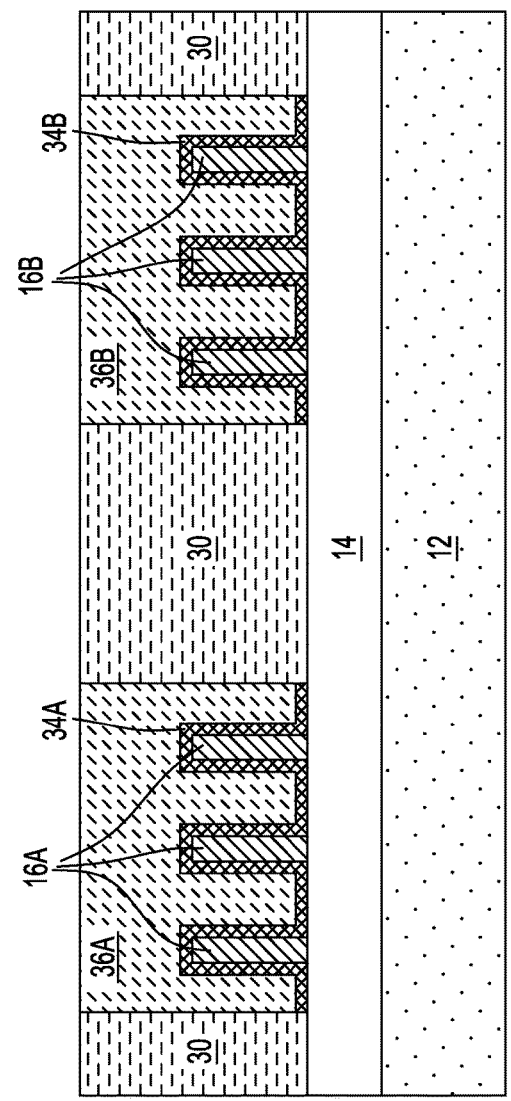
FIG. 7A
FIG. 7B

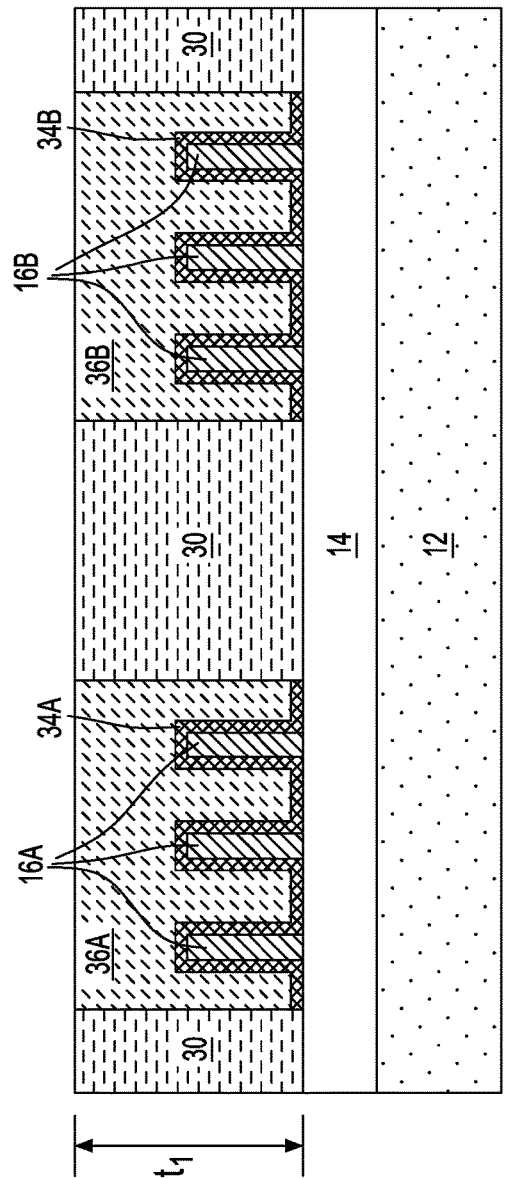
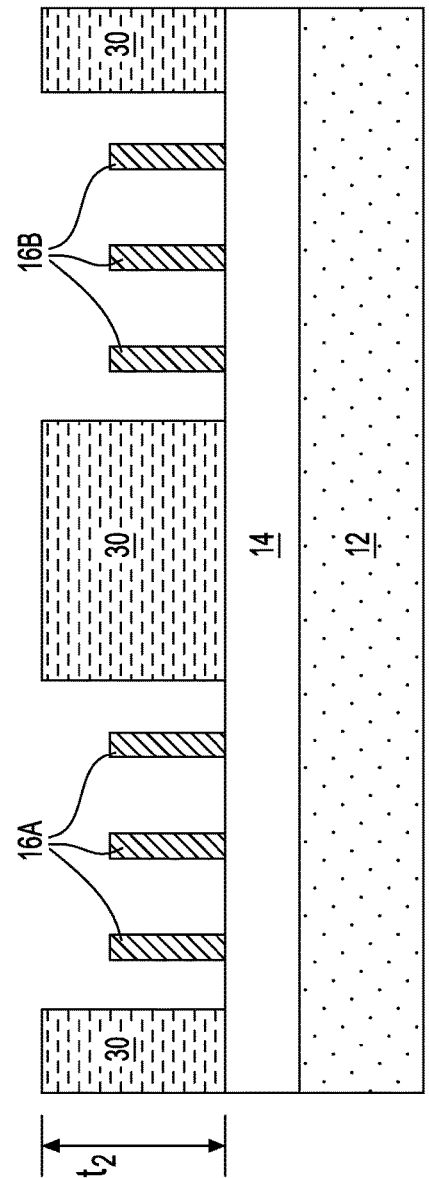
FIG. 8A
FIG. 8B

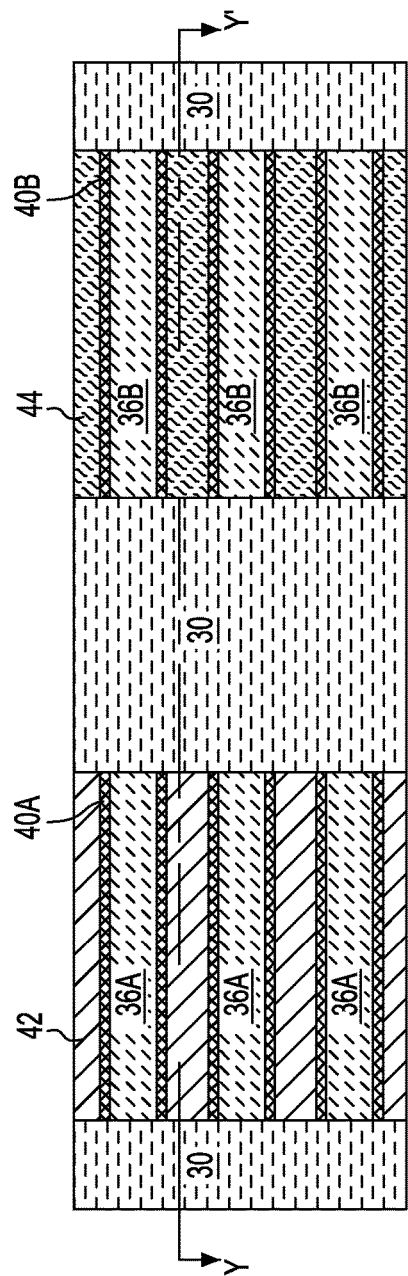
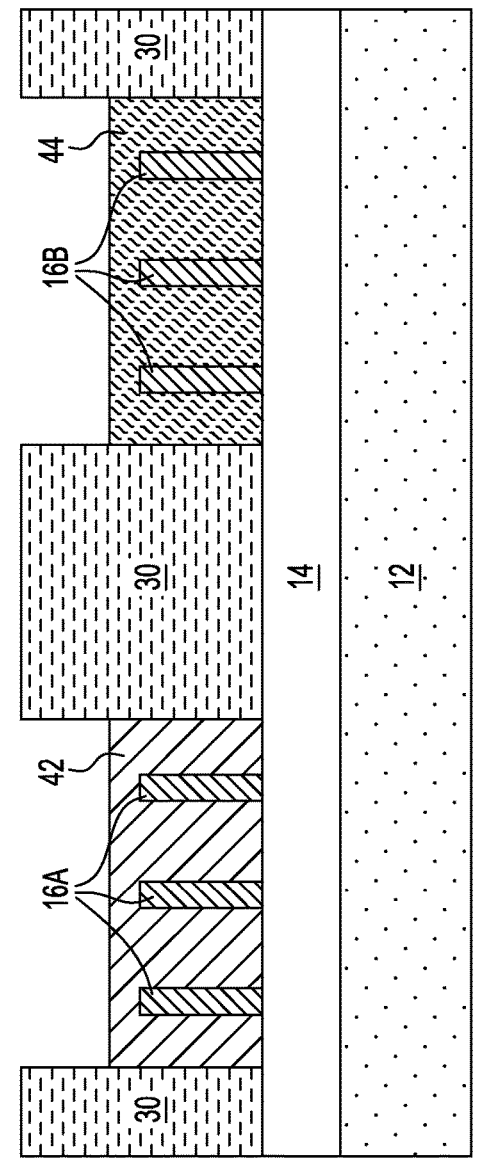
FIG. 9A
FIG. 9B

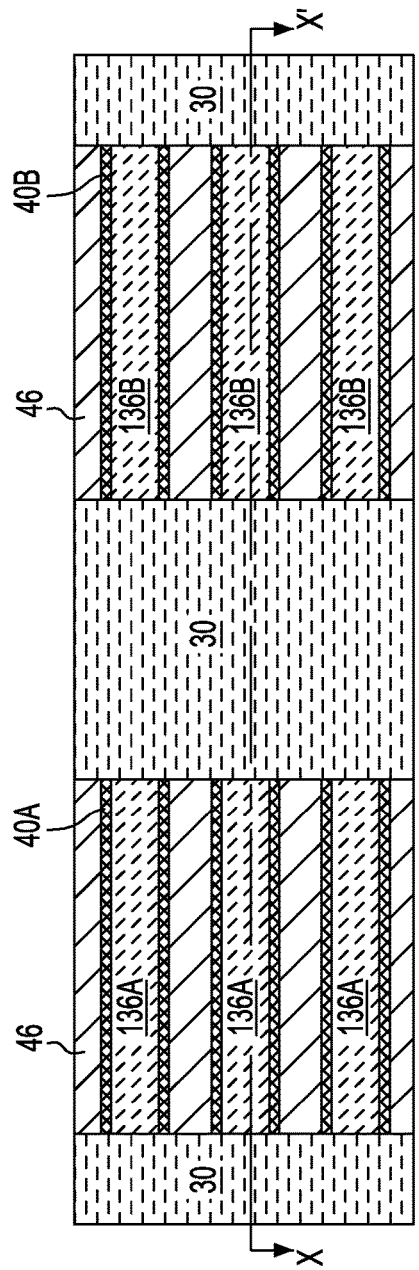
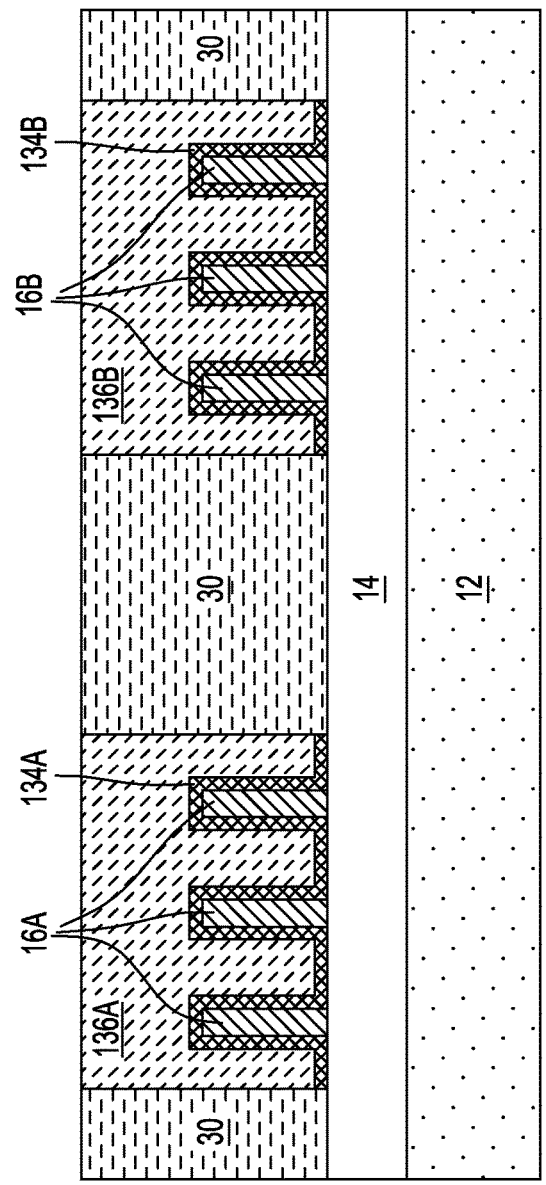
FIG. 10A
FIG. 10B

METHOD AND STRUCTURE FOR IMPROVING FINFET WITH EPITAXY SOURCE/DRAIN

BACKGROUND

The present application relates to semiconductor device fabrication and, more particularly to a method and a structure that enable preventing electrical shorts of source/drain regions in fin field effect transistors (FinFETs).

FinFET technology promises continued scaling of complementary metal oxide semiconductor (CMOS) technology due to the potential to reduce deleterious short channel effects. In current FinFET-based CMOS fabrication processes, a gate electrode needs to extend beyond the active region to a greater extent than it would otherwise be needed to ensure that a source region and a drain region (collectively referred to as "source/drain" regions) are not merged at ends of the gate electrode which causes electrical shorts of the source/drain regions, especially when source/drain epitaxial growth is used to merge the semiconductor fins. However, the large gate extension leads to area penalty as well as additional capacitance between the gate electrode and the source/drain regions. As such, a method is needed that enables preventing electrical shorts of source/drain regions in FinFETs without compromising transistor packing density and performance of FinFETs.

SUMMARY

The present application provides a method and a structure that enable preventing the electrical shorts of source/drain regions without the need of having a large gate electrode extension in FinFETs. Isolation structures are formed to laterally surround a gate material block such that each sidewall of the gate material block abuts a corresponding sidewall of the isolation structures. Sidewalls of the gate material bock define ends of gate structures to be subsequently formed. The isolation structures obstruct lateral growth of a semiconductor material during a selective epitaxial grown process in formation of source/drain regions, thereby preventing merging of the source/drain regions at the ends of the gate structures. As a result, a lateral distance between each sidewall of the gate material block and a corresponding outermost sidewall of an array of a plurality of semiconductor fins can be made sufficiently small without causing the electrical shorts of the source/drain regions.

In one aspect of the present application, a method of forming a semiconductor structure is provided. The method includes patterning a gate material stack layer to form a gate material block. The gate material block covers a plurality of semiconductor fins located on a substrate. Next, isolation structures are formed at opposite ends of the gate material block. Each sidewall of the gate material block abuts a corresponding sidewall of the isolation structures. After patterning the gate material block to provide at least one gate stack overlying a channel portion of each of the plurality of semiconductor fins, a semiconductor material is epitaxially grown on portions of each of the plurality of semiconductor fins that are not covered by the at least one gate stack to provide an epitaxial source region merging the plurality of semiconductor fins on a first side of the at least one gate stack and an epitaxial drain region merging the plurality of semiconductor fins on a second side of the at least one gate stack opposite the first side.

In another aspect of the present application, a semiconductor structure is provided. The semiconductor structure includes a plurality of semiconductor fins located on a region of a substrate, at least one gate structure overlying a channel portion of each of the plurality of semiconductor fins, and an epitaxial source region located on a first side of the at least one gate structure and an epitaxial drain region located on a second side of the at least one gate structure opposite the first side. The epitaxial source region merges the plurality of semiconductor fins on the first side. The epitaxial drain region merges the plurality of semiconductor fins on the second side. The semiconductor structure further includes a first isolation structure located at a first end of each of the at least one gate structure, the epitaxial source region and the epitaxial drain region and a second isolation structure located at a second end of each of the at least one gate structure, the epitaxial source region and the epitaxial drain region opposite the first end. The first isolation structure has a sidewall abutting the first end of each of the at least one gate structure, the epitaxial source region and the epitaxial drain region. The second isolation structure has a sidewall abutting the second end of each of the at least one gate structure, the epitaxial source region and the epitaxial drain region.

BRIEF DESCRIPTION OF THE DRAWINGS

FIG. 1A is a top view of an exemplary semiconductor structure including an array of first semiconductor fins and an array of second semiconductor fins formed on a substrate in accordance with an embodiment of the present application.

FIG. 1B is a cross-sectional view of the exemplary semiconductor structure of FIG. 1A along line X-X'.

FIG. 3A is a top view of the exemplary semiconductor structure of FIG. 2A after forming a first gate material block overlying the first semiconductor fins and a second gate material block overlying the second semiconductor fins.

FIG. 3B is a cross-sectional view of the exemplary semiconductor structure of FIG. 3A along line X-X'.

FIG. 7A is a top view of the exemplary semiconductor structure of FIG. 6A after forming a first gate spacer on each sidewall of the first gate stacks and a second gate spacer on each sidewall of the second gate stacks.

FIG. 7B is a cross-sectional view of the exemplary semiconductor structure of FIG. 7A along line X-X'.

FIG. 8A is a cross-sectional view of the exemplary semiconductor structure of FIG. 7A along line X-X' and FIG. 8B is a cross-sectional view of the exemplary semiconductor structure of FIG. 7A along line Y-Y' illustrating portions of the isolation structures abutting first gate structures and second gate structures have a height greater than a height of portions of the isolation structures where source/drain regions are to be formed.

FIG. 9A is a top view of the exemplary semiconductor structure of FIG. 7A after forming first epitaxial source/drain groins on opposite sides of the gate structures and second epitaxial source/drain regions on opposite sides of the second gate structures.

FIG. 9B is a cross-sectional view of the exemplary semiconductor structure of FIG. 9A along line Y-Y'.

FIG. 10A is a top view of the exemplary semiconductor structure of FIG. 9A after forming interlevel dielectric layer (ILD) portions over the first epitaxial source/drain regions and the second epitaxial source/drain regions.

FIG. 10B is a cross-sectional view of the exemplary semiconductor structure of FIG. 10A along line X-X'.

DETAILED DESCRIPTION

Figure 2A:
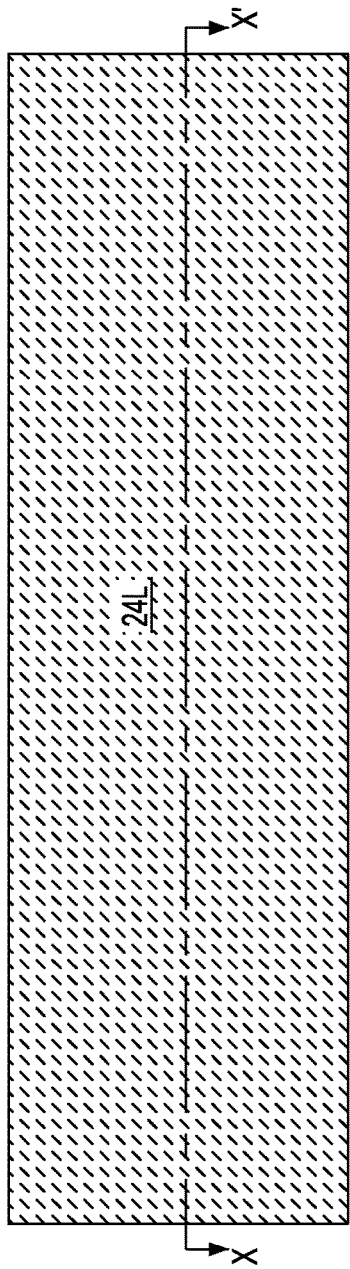
FIG. 2A is a top view of the exemplary semiconductor structure of FIG. 1A after forming a gate material stack layer over the first semiconductor fins, the second semiconductor fins and exposed surfaces of a buried insulator layer of the substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIGS. 1A-1B, there is illustrated an exemplary semiconductor structure that can be employed according to an embodiment of the present application. Specifically, the semiconductor structure includes a substrate having an array of first semiconductor fins 16A formed on a first region of the substrate and an array of second semiconductor fins 16B formed on a second region of the substrate. In one embodiment, the first region can be an n-type FinFET region and the second region can be a p-type FinFET region.

In one embodiment, the first and the semiconductor fins 16A, 16B can be formed from a bulk substrate including a bulk semiconductor material throughout (not shown). In another embodiment and as shown in FIG. 1B, the first and the second semiconductor fins 16A, 16B can be formed by patterning a top semiconductor layer of a semiconductor-on-insulator (SOI) substrate. The SOI substrate typically includes, from bottom to top, a handle substrate 12, a buried insulator layer 14 and a top semiconductor layer (not shown) from which the first and the second semiconductor fins 16A, 16B are formed.

The handle substrate 12 may include a semiconductor material, such as, for example, Si, Ge, SiGe, SiC, SiGeC, and III/V compound semiconductors. The handle substrate 12 provides mechanical support to the buried insulator layer 14 and the top semiconductor layer. The thickness of the handle substrate 12 can be from 30 µm to about 2 mm, although less and greater thicknesses can also be employed.

The buried insulator layer 14 may include a dielectric material such as silicon oxide, silicon nitride, silicon oxynitride, or a combination thereof. The thickness of the buried insulator layer 14 can be from 50 nm to 200 nm, with a thickness from 100 nm to 150 nm being more typical.

The top semiconductor layer may include a semiconductor material such as, for example, Si, Ge, SiGe, SiC, SiGeC, and III/V compound semiconductors such as, for example, InAs, GaAs, and InP. The semiconductor materials of the top semiconductor layer and the handle substrate may be the same or different. Typically, each of the handle substrate 12 and the top semiconductor layer comprises a single crystalline semiconductor material, such as, for example, single crystalline silicon. The top semiconductor layer may or may not be doped with p-type dopants and/or n-type dopants. Examples of p-type dopants include, but are not limited to, boron, aluminum, gallium and indium. Examples of n-type dopants, include but are not limited to, antimony, arsenic and phosphorous. The thickness of the top semiconductor layer can be from 10 nm to 200 nm, with a thickness from 30 nm to 70 nm being more typical.

Optionally, a pad layer which may be comprised of silicon nitride or a bilayer comprised of a silicon nitride layer and an underlying silicon oxide layer can be deposited on the top semiconductor layer 16. The pad layer, when present, protects the top semiconductor layer during the subsequent patterning processes.

In one embodiment, the first and the second semiconductor fins 16A, 16B can be formed by lithography and etching. The lithographic step includes applying a photoresist layer (not shown) atop the top semiconductor layer (or the pad layer, if present), exposing the photoresist layer to a desired pattern of radiation, and developing the exposed photoresist layer utilizing a conventional resist developer. The etching process may be a dry etch and/or a wet chemical etch. Illustrative examples of suitable dry etching processes that can be used in the present application include reactive ion etch (RIE), ion beam etching, plasma etching or laser ablation. Typically, a RIE process is used. The etching process transfers the pattern from the patterned photoresist layer to the top semiconductor layer or first to the cap layer, if present, and thereafter to the underlying top semiconductor layer utilizing the buried insulator layer 14 as an etch stop. After transferring the pattern into the top semiconductor layer, the patterned photoresist layer can be removed utilizing a conventional resist stripping process such as, for example, ashing. Alternatively, the semiconductor fins 16A, 16B can also be formed utilizing a sidewall image transfer (SIT) process. In a typical SIT process, spacers are formed on sacrificial mandrels. The sacrificial mandrels are removed and the remaining spacers are used as an etch mask to etch the top semiconductor layer. The spacers are then removed after the semiconductor fins have been formed.

In one embodiment of the present application, the first and the second semiconductor fins 16A, 16B are formed substantially parallel to each other. The height of each of the first and the second semiconductor fin 16A, 16B that is formed can be from 5 nm to 300 nm, although lesser or greater heights can also be employed. The width of each of the first and the second semiconductor fin 16A, 16B can be in a range from 5 nm to 50 nm, although lesser or greater widths can also be employed. The first and the second semiconductor fins 16A, 16B in each array may have a pitch ranging from 20 nm to 100 nm, with a pitch ranging from 30 nm to 50 nm being more typical.

In some embodiments of the present application and when the pad layer is present, the pad layer that remains atop the first and the second semiconductor fins 16A, 16B can be removed at this stage. The removal of the remaining non-etched portion of pad layer can be achieved by performing a selective etching process or by utilizing a planarization process such as chemical mechanical planarization (CMP). In some embodiments, a portion of the pad layer can remain atop each of the first and the semiconductor fins 16A, 16B.

Figure 2B:
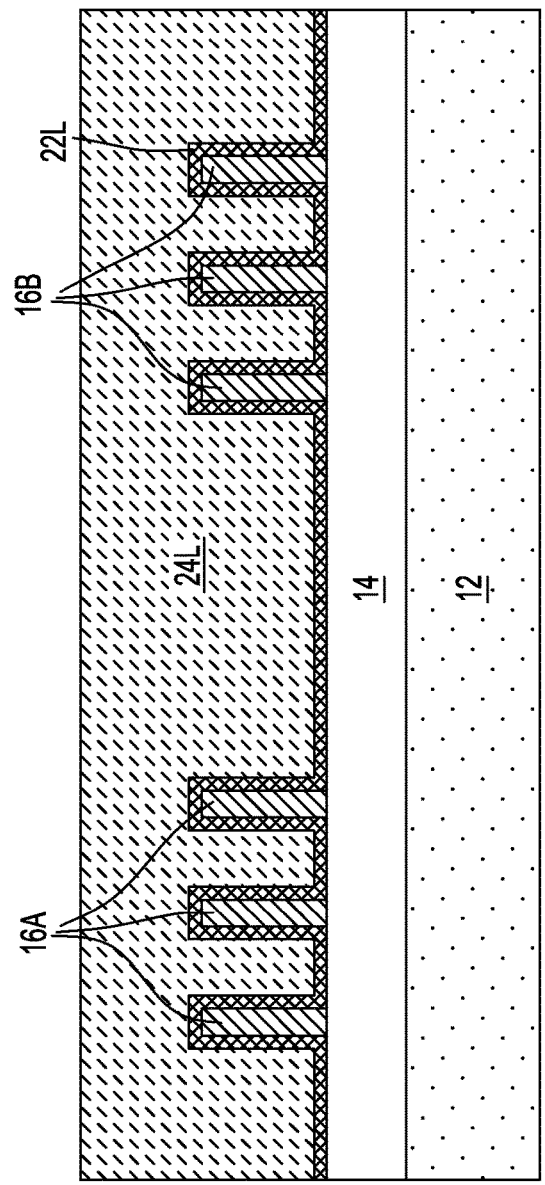
FIG. 2B is a cross-sectional view of the exemplary semiconductor structure of FIG. 2A along line X-X'.

Referring now to FIGS. 2A-2B, there is illustrated the exemplary semiconductor structure of FIGS. 1A-1B after forming a gate material stack layer over the first and the second semiconductor fins 16A, 16B and exposed surfaces of the buried insulator layer 14. In one embodiment and when the gate material stack layer is used for forming gate stacks in a gate-first scheme, the gate material stack layer includes, from bottom to top, a gate dielectric layer 22L and a gate electrode layer 24L.

The gate dielectric layer 22L may include a dielectric material such silicon oxide, silicon nitride, or silicon oxynitride. In one embodiment, the gate dielectric layer 22L may include a high-k dielectric material with a dielectric constant greater than 8.0. Examples of high-k dielectric material include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high-k dielectric materials can also be employed as the gate dielectric layer. Each value of x is independently from 0.5 to 3 and each value of y is independently from 0 to 2.

The gate dielectric layer 22L can be formed by any deposition technique including, for example, chemical vapor deposition (CVD), plasma enhanced chemical vapor deposition (PECVD), physical vapor deposition (PVD), atomic layer deposition (ALD), or sputtering. Alternatively, the gate dielectric layer 22L can also be formed by a thermal growth process such as, for example, oxidation, nitridation or oxynitridation to convert surface portions of each of the first and the second semiconductor fins 16A, 16B into a dielectric material. The gate dielectric layer 22L that is formed can have a thickness ranging from 1 nm to 10 nm, although lesser or greater thicknesses can also be employed. In some embodiments of the present application, the gate dielectric layer 22L can be omitted.

The gate electrode 24L may include any conductive material including, but not limited to, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof.

The gate electrode layer 24L can be formed by utilizing a deposition process including, for example, CVD, PECVD, PVD, ALD, or sputtering. The thickness of the gate electrode layer 24L can be from 20 nm to 300 nm, although lesser or greater thicknesses can also be employed.

In another embodiment and when the gate material stack layer is used for forming sacrificial gate stacks in a gate-last scheme, the sacrificial gate material stack layer may include a sacrificial gate dielectric layer composed of a dielectric material such as silicon oxide and a sacrificial gate material layer composed of a conductive material such as polysilicon (not shown). The term "sacrificial gate stack" as used herein refers to a placeholder structure for a functional gate stack to be subsequently formed. The "functional gate stack" as used herein refers to a permanent gate stack used to control output current (i.e., flow of carriers in the channel) of a semiconducting device through electrical fields.

Referring now to FIGS. 3A-3B, there is illustrated the exemplary semiconductor structure of FIGS. 2A-2B after forming a first gate material block overlying the first semiconductor fins 16A and a second gate material block overlying the second semiconductor fins 16B. The first and the second gate material blocks can be formed by lithographic patterning (or any other suitable patterning techniques) and etching the gate material stack layer (22L, 24L).

The patterning of the gate material stack layer (22L, 24L), for example, by applying a mask layer (not shown) above a topmost surface of the gate material stack layer (22L, 24L) (i.e., a top surface of the gate electrode layer 24L) and lithographically patterning the mask layer to define a set of areas covered by the patterned mask layer. The pattern in the mask layer is subsequently transferred into the gate electrode layer 24L and the gate dielectric layer 22L. The remaining portions of the mask layer may be removed. The mask layer can be a photoresist layer or a photoresist layer in conjunction with hardmask layer(s). The patterning of the gate material stack layer (22L, 24L) can be done by any suitable patterning techniques such as direct lithography, sidewall imaging transfer, directly self-assembling, or any suitable combination of those techniques. In one embodiment, the gate material stack layer (22L, 24L) is patterned by at least one etch, such as an anisotropic etch using the buried insulator layer 14 as an etch stop.

A remaining portion of the gate dielectric layer 22L overlying the first semiconductor fins 16A is herein referred to as a first gate dielectric layer portion 22A. A remaining portion of the gate electrode layer 24L overlying the first semiconductor fins 16A is herein referred to as a first gate electrode layer portion 24A. The first gate dielectric layer portion 22A and the first gate electrode layer portion 24A collectively constitute the first gate material block (22A, 24A). A remaining portion of the gate dielectric layer 22L overlying the second semiconductor fins 16B is herein referred to as a second gate dielectric layer portion 22B. A remaining portion of the gate electrode layer 24L overlying the second semiconductor fins 16B is herein referred to as a second gate electrode layer portion 24B. The second gate dielectric layer portion 22B and the second gate electrode layer portion 24B collectively constitute the second gate material block (22B, 24B).

The first gate material block (22A, 24A) that is formed has a pair of opposite first sidewalls 26A. In one embodiment, the first sidewalls 26A that define the ends of first gate structures to be subsequently formed are oriented substantially parallel to sidewalls of the first semiconductor fins 16A. The lateral distance $D_1$ between each first sidewall 26A of the first gate material block (22A, 24A) and a corresponding outermost sidewall of the first semiconductor fins 16A can be made sufficiently small as long as it does not affect the normal operation of the first gate structures. The outermost sidewalls of the semiconductor fins are the outer sidewalls of the semiconductor fins at each end of the array. Likewise, the second gate material block (22B, 24B) that is formed has a pair of opposite second sidewalls 26B. The second sidewalls 26B that define the ends of the second gate structures to be subsequently formed are oriented substantially parallel to sidewalls of the second semiconductor fins 16B. The lateral distance $D_2$ between each second sidewall 26B of the second gate material block (22B, 24B) and a corresponding outermost sidewall of the second semiconductor fins 16B can be made sufficiently small as long as it does not affect the normal operation of the second gate structures. In one embodiment, each of the lateral distances $D_1$ and $D_2$ can be from 5 nm to 40 nm, although lesser or greater distances can also be employed.

The patterning of the gate material stack layer (22L, 24L) also forms isolation trenches 28. The isolation trenches 28 expose portions of the top surface of buried insulator layer 14 and separate the first gate material block (22A, 24A) from the second gate material block (22B, 24B), thus the isolation structures later formed therein can provide electrical isolation between different arrays of semiconductor fins 16A, 16B. The width of each isolation trench 28 that is defined by the first sidewall 26A and an adjacent second sidewall 26B can also be made sufficiently small to enable higher transistor packing density. In one embodiment, the width of each isolation trench 28 can be from 10 nm and 100 nm, although lesser or greater widths can also be employed.

Figure 4A:
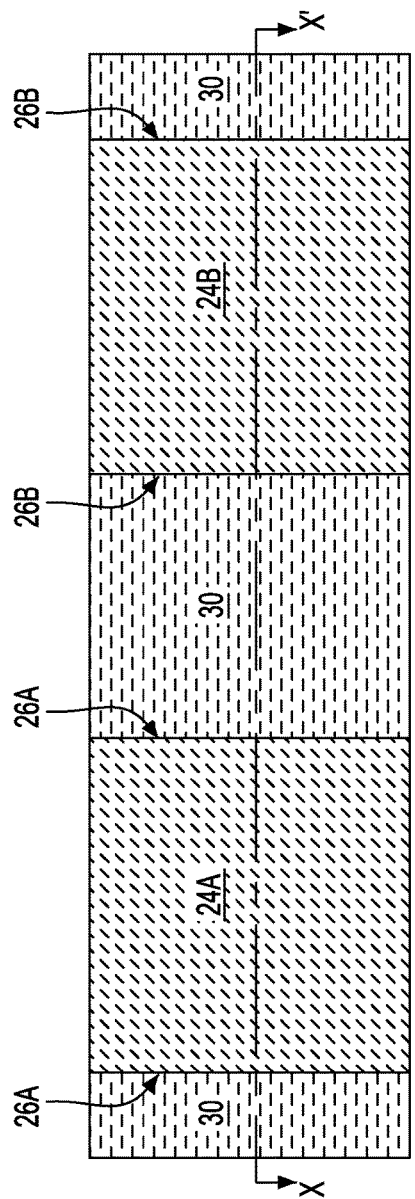
FIG. 4A is a top view of the exemplary semiconductor structure of FIG. 3A after forming isolation structures laterally surrounding and abutting the first gate material block and the second gate material block.
Figure 4B:
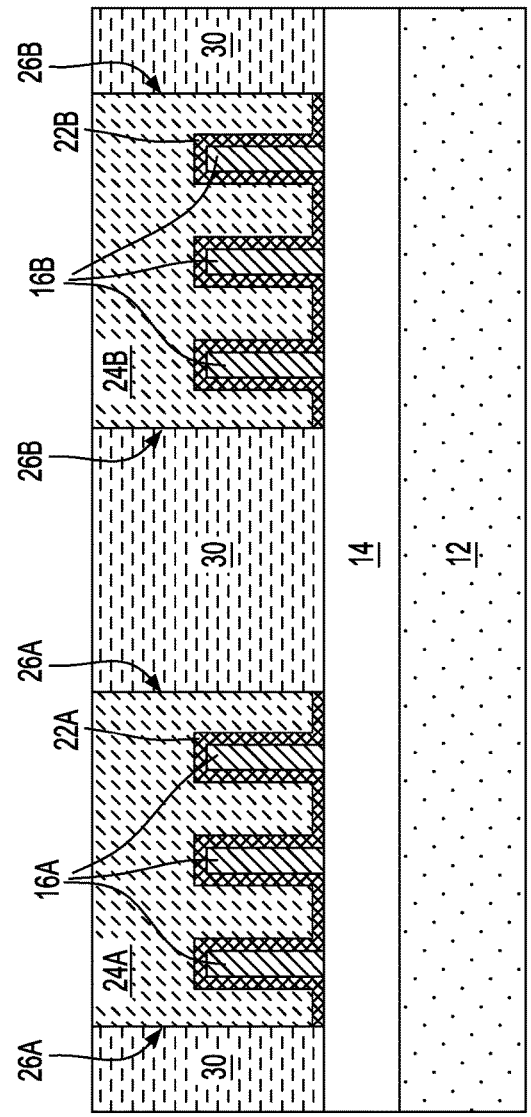
FIG. 4B is a cross-sectional view of the exemplary semiconductor structure of FIG. 4A along line X-X'.

Referring now to FIGS. 4A-4B, there is illustrated the exemplary semiconductor structure of FIGS. 3A-3B after forming isolation structures 30 within the isolation trenches 28. The isolation structures 30 can be formed by depositing a dielectric material within the isolation trenches 28 and over the topmost surfaces of the first gate material block (22A, 24A) and the second gate material block (22B, 24B) (i.e., top surfaces of the gate electrode layer portions 24A, 24B) to provide a trench fill dielectric layer (not shown). The dielectric material of the trench fill dielectric layer can include, for example, silicon oxide, silicon nitride, silicon oxynitride, organosilicate glass (OSG), or any suitable combination of those materials. The trench fill dielectric layer can be deposited by a self-planarizing deposition process such as spin coating, or by a non-self-planarizing deposition process such as CVD.

Excess dielectric material of the trench fill dielectric layer deposited above the topmost surfaces of the first gate material block (22A, 24A) and the second gate material block (22B, 24B) is subsequently removed, for example, by CMP or a recess etch. After the planarization, the isolation structures 30 have top surfaces coplanar with the top surfaces of the first and the second gate electrode layer portions 24A, 24B. The isolation structures 30 laterally surround and abut the first sidewalls 26A of the first gate material block (22A, 24A) and the second sidewalls 26B of the second gate material block (22B, 24B).

Figure 5A:
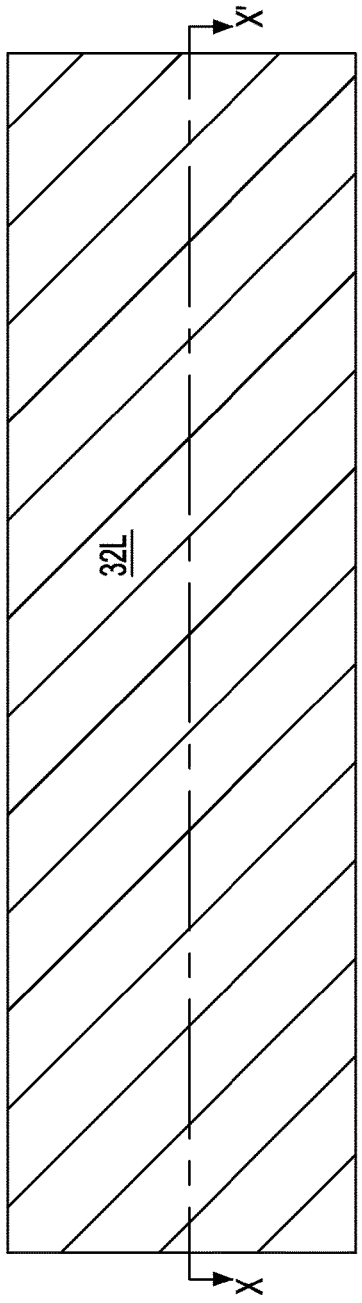
FIG. 5A is a top view of the exemplary semiconductor structure of FIG. 4A after forming a hardmask layer over the first gate material block, the second gate material block and the isolation structures.
Figure 5B:
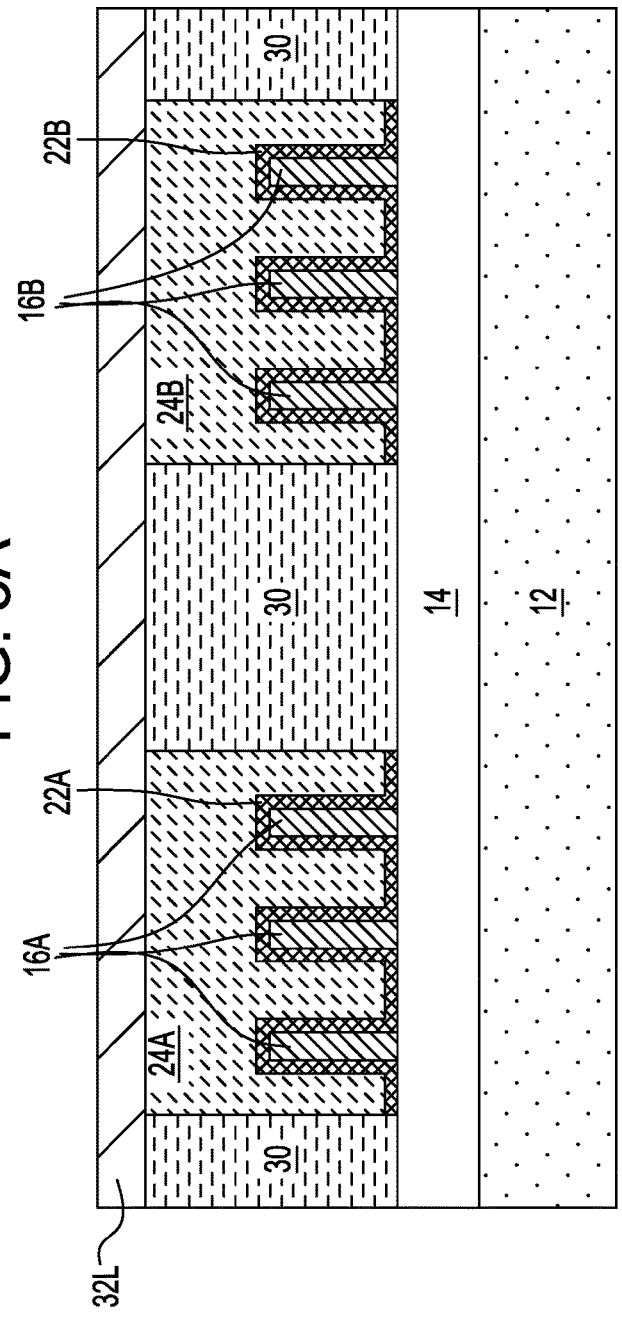
FIG. 5B is a cross-sectional view of the exemplary semiconductor structure of FIG. 5A along line X-X'.

Referring now to FIGS. 5A-5B, there is illustrated the exemplary semiconductor structure of FIGS. 4A-4B after forming a hardmask layer 32L over the first gate material block (22A, 24B), the second gate material block (22B, 24B) and the isolation structures 30. The hardmask layer 32L may comprise a dielectric material that is different from the dielectric material of the trench fill dielectric layer so that the hardmask layer 32L can be removed selective to the isolation structures 30. Exemplary dielectric materials that can be employed as the hardmask layer 32L include, but are not limited to silicon oxide, silicon nitride, or silicon oxynitride. In some embodiments, the hardmask layer 32L can be omitted.

The hardmask layer 32L can be formed by a deposition process including, for example, CVD, PECVD, PVD, or ALD. The hardmask layer 32L that is formed can have a thickness ranging from 25 nm to 100 nm, although lesser or greater thicknesses can also be employed.

Figure 6A:
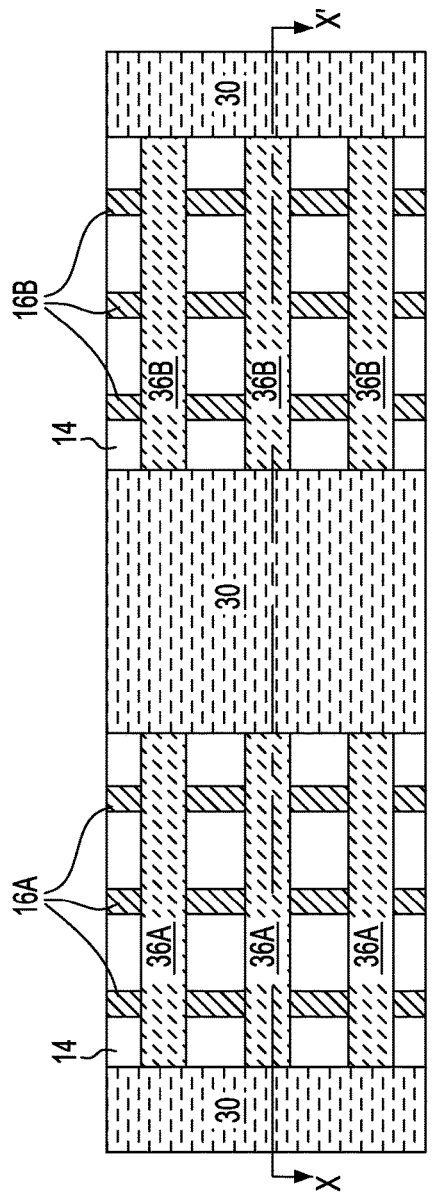
FIG. 6A is a top view of the exemplary semiconductor structure of FIG. 5A after forming first gate stacks overlying a channel portion of each first semiconductor fin and second gate stacks overlying a channel portion of each second semiconductor fin.
Figure 6B:
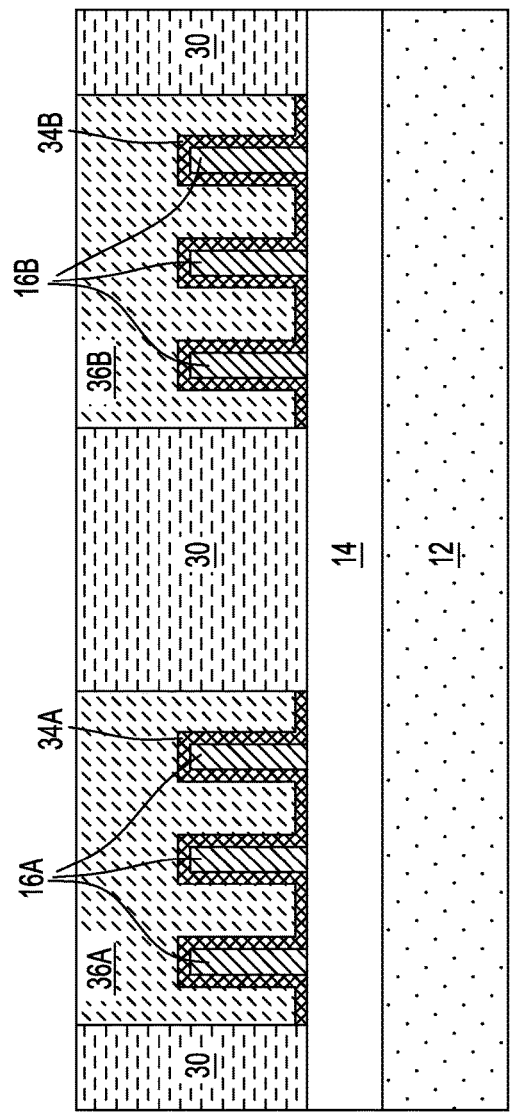
FIG. 6B is a cross-sectional view of the exemplary semiconductor structure of FIG. 6A along line X-X'.

Referring now to FIGS. 6A-6B, there is illustrated the exemplary semiconductor structure of FIGS. 5A-5B after forming first gate stacks overlying a channel portion of each first semiconductor fin 16A and second gate stacks overlying a channel portion of each second semiconductor fin 16B. As described before, depending on the type of the gate material stack layer used, the gate stacks that are formed at this stage can be functional gate stacks or sacrificial gate stacks.

The first and the second gate stacks can be formed by first applying a photoresist layer (not shown) over a top surface of the hardmask layer 32L, when present, or topmost surfaces of the first gate material block (22A, 24A) and the second gate material block (22B, 24B) and isolation structures 30. The photoresist layer is then patterned by lithographic exposer and development. The pattern formed in the photoresist layer is transferred into the hardmask layer 32L, when present, the first gate material block (22A, 24A) and the second gate material block (22B, 24B) to form the first gate stacks straddling the firsts semiconductor fins 16A and the second gate stacks straddling the second semiconductor fins 16B. Any suitable patterning techniques such as direct lithography, sidewall imaging transfer, directly self-assembling, or any suitable combination of those techniques can be used to form the first and second gate stacks. In one embodiment, the hardmask layer 32L, the first gate material block (22A, 24A) and the second gate material block (22B, 24B) is patterned by at least one etch which can be an anisotropic etch such as RIE. After transferring the pattern into the first gate material block (22A, 24A) and the second gate material block (22B, 24B), the patterned photoresist layer and remaining portions of the hardmask layer 32L, when present, are removed. The removal of the remaining portions of the hardmask layer re-exposes isolation structures 30.

A remaining portion of the first gate dielectric layer portion 22A is herein referred to as a first gate dielectric 34A. A remaining portion of the first electrode gate layer portion 24A is herein referred to as a first gate electrode 36A. The first gate dielectric 34A and the first gate electrode 36A collectively constitute the first gate stack (34A, 36A). A remaining portion of the second gate dielectric layer portion 22B is herein referred to as a second gate dielectric 34B. A remaining portion of the second gate layer portion 24B is herein referred to as a second gate electrode 36B. The second gate dielectric 34B and the second gate electrode 36B collectively constitute the second gate stack (34B, 36B).

The isolation structures 30 may then be planarization such that top surfaces of the isolation structure 30 are coplanar with topmost surfaces of the gate stacks (34A, 36A, 34B 36B) (i.e., top surfaces of the gate electrode 36A, 36B).

Because the isolation structures 30 are formed before patterning the gate material blocks (22A, 24A, 22B, 24B) to form the gate stacks (34A, 36A, 34B, 36B), the ends of the gate stacks (34A, 36A, 34B, 36B) are self-aligned with sidewalls of the isolation structures 30.

Referring now to FIGS. 7A-7B, there is illustrated the exemplary semiconductor structure of FIGS. 6A-6B after forming a first gate spacer 40A on each sidewall of the first gate stacks (34B, 36B) and a second gate spacer 40B on each sidewall of the second gate stacks (34B, 36B). The first and the second gate spacers 40A, 40B can be formed by first depositing a conformal gate spacer material layer (not shown) on exposed surfaces of the semiconductor fins 16A, 16B, the isolation structures 30, the gate stacks (34A, 36A, 34B, 36B) and the buried insulator layer 14 utilizing any conventional deposition process including, for example, CVD or ALD. Subsequently, horizontal portions of the conformal gate spacer material layer are removed by an anisotropic etch, such as, for example, RIE. The RIE process is continued so that vertical portions of the conformal gate spacer material layer present on the sidewalls of the semiconductor fins 16A, 16B are also removed. Remaining vertical portions of the conformal gate spacer material layer present on sidewalls of the first gate stacks (34A, 36A) constitute the first gate spacer 40A. Remaining vertical portions of the conformal gate spacer material layer present on sidewalls of the second gate stacks (34B, 36B) constitute the second gate spacer 40B. Because the isolation structures 30 abut the ends of the first gate stacks (34A, 36A) and the second gate stacks (34B, 36B), the gate spacers 40A, 40B can only be formed on sidewalls of the gate stacks (34A, 36A, 34B, 36B), but not on the ends of the gate stacks (34A, 36A, 34B, 36B,). Each first gate stack (34A, 36A) and a first gate spacer 40A located on each sidewall of the first gate stack (34A, 36A) constitute a first gate structure. Each second gate stack (34B, 36B) and a second gate spacer 40B located on each sidewall of the second gate stack (34B, 36B) constitute a second gate structure.

Materials used to form the gate spacers 40A, 40B may include a dielectric oxide, nitride or oxynitride. In one embodiment, each gate spacer 40A, 40B is composed of silicon nitride. The gate spacers 40A, 40B can have a width, as measured at the base, from 2 nm to 100 nm, with a width from 6 nm to 10 nm being more typical.

In some embodiment and as shown in FIGS. 8A-8B, due to the finite each selectivity between the material of the isolation structures 30 and materials of the gate material blocks (22A, 24A, 22B, 24B) and the gate spacer material layer, the etching processes used to form the gate stacks (34A, 34B, 36A, 34B) and the gate spacers 40A, 40B may recess portions of the isolation structures 30 abutting the gate structures (34A, 36A, 40A, 34B, 36B, 40B) to a lesser extent comprising to portions of the isolation structures 30 on opposite sides of the gate structures (34A, 36A, 40A, 34B, 36B, 40B) (i.e., portions where source/drain regions are to be formed). The portions of the isolation structure 30 abutting the gate structures (34A, 36A, 40A, 34B, 36B, 40B) thus may have a height ($t_1$) greater than the height ($t_2$) of portions of the isolation structures 30 where source/drain regions are to be formed.

Referring now to FIGS. 9A-9B, there is illustrated the exemplary semiconductor structure of FIGS. 7A-7B after forming first epitaxial source/drain regions 42 on opposite sides of the first gate structures (34A, 36A, 40A) and second epitaxial source/drain regions 44 on opposite sides of the second gate structures (34B, 36B, 40B). In one embodiment, the sidewalls of first epitaxial source/drain groins 42 and sidewalls of the second epitaxy source/drain regions 44 abut the sidewalls of the isolation structures 30. In one embodiment, the portions of the isolation structure 20 abutting the gate structures (34A, 36A, 40A, 34B, 36B, 40B) may have a height the same or greater than the height of portions of the isolation structures 30 abutting the source/drain regions 42, 44.

The first epitaxial source/drain regions 42 and the second epitaxial source/drain regions 44 may include the same or different semiconductor materials. The first epitaxial source/drain regions 42 and the second epitaxial source/drain regions 44 can be formed utilizing block mask technique when different semiconductor materials are employed in forming the epitaxial source/drain regions 42, 44. No such block mask is needed when the first epitaxial source/drain regions 42 and the second epitaxial source/drain regions 44 are composed of a same semiconductor material.

In one embodiment and as shown in FIGS. 9A-9B, when the first epitaxial source/drain regions 42 and the second epitaxial source/drain regions 44 are composed of different semiconductor materials, a first mask layer (not shown) is first applied over the semiconductor fins 16A, 16B, the gate structures (34A, 36A, 40A, 34B, 36B, 40B) and exposed surfaces of the buried insulator layer 14 and lithographically patterned so that the patterned first mask layer covers the second semiconductor fins 16B, while exposing the first semiconductor fins 16A that would be subjected to the epitaxial deposition and ion implantation. The first mask layer may include any material that can be easily patterned and removed without damaging the underlying components. In one embodiment, the first mask layer includes amorphous carbon with hydrogen content less than about 15 atomic %.

The first epitaxial source/drain regions 42 can be formed by epitaxially depositing a first semiconductor material over top and sidewall surfaces of the first semiconductor fins 16A, but not on dielectric surfaces such as the surfaces of the isolation structures 30, the first gate spacers 40A and the buried insulator layer 14. The epitaxial growth process continues until the epitaxially deposited first semiconductor material completely fills the spaces between the first semiconductor fins 16A so as to merge individual first semiconductor fins 16A together, thereby reducing the source/drain resistance for the n-type FinFETs. In one embodiment, the first epitaxial source/drain regions 42 may be composed of Si:C with the strain effect tuned to enhance the performance of n-type FinFETs.

The first semiconductor material of the first epitaxial source/drain regions 42 can be deposited as an intrinsic semiconductor material, or can be deposited with in-situ doping. If the first semiconductor material is deposited as an intrinsic semiconductor material, the first epitaxial source/drain regions 42 can be subsequently doped (ex-situ) with an n-type dopant (e.g., P, As or Sb) utilizing ion implantation, gas phase doping, or dopant out diffusion from a sacrificial dopant source material. After the formation of the first epitaxial source/drain regions 42, the patterned mask layer can be removed, for example, by oxygen-based plasma etching.

The second epitaxial source/drain regions 44 can be formed by performing the processing steps described above with respect to the first epitaxial source/drain regions 42. After forming a patterned second mask layer to cover the first epitaxial source/drain region 42 and expose the second semiconductor fins 16B, a second semiconductor material is epitaxially deposited over top and sidewall surfaces of the second semiconductor fins 16B, but not on dielectric surfaces such as the surfaces of the isolation structures 30, the second gate spacers 40B and the buried insulator layer 14. The epitaxial growth process continues until the epitaxially deposited second semiconductor material completely fills the spaces between the second semiconductor fins 16B so as to merge individual second semiconductor fins 16B together, thereby reducing the source/drain resistance for the p-type FinFETs. In one embodiment, the second epitaxial source/ drain regions 44 may be composed of SiGe with the strain effect tuned to enhance the performance of p-type FinFETs.

The second semiconductor material of the second epitaxial source/drain regions 44 can be deposited as an intrinsic semiconductor material, or can be deposited with in-situ doping. If the second semiconductor material is deposited as an intrinsic semiconductor material, the second epitaxial source/drain regions 44 can be subsequently doped (ex-situ) with a p-type dopant (e.g., B, Al, Ga or In) utilizing ion implantation, gas phase doping or dopant out diffusion from a sacrificial dopant source material. After the formation of the second epitaxial source/drain regions 54, the patterned second mask layer can be removed, for example, by oxygen-based plasma etching.

In some embodiments of the present application, the epitaxial growth of the first and the second semiconductor materials can be effected by placing the semiconductor structure into a reaction chamber, and simultaneously, or alternately, flowing at least one silicon source reactant gas (such as $SiH_4$, $Si_2H_6$, $SiH_2Cl_2$, $GeH_4$, $C_2H_2$, $C_2H_4$) and an etchant gas (such as HCl) into the reaction chamber. Optionally, a carrier gas such as $H_2$, $N_2$, $H_2$, and/or Ar can be flowed into the reaction chamber. The temperature for epitaxial deposition typically ranges from 550° C. to 1300° C. The apparatus for performing the epitaxial growth may include a CVD apparatus, such as atmospheric pressure CVD (APCVD), low pressure CVD (LPCVD) and PECVD.

The n-type dopants in the first epitaxial source/drain regions 42 and p-type dopants in the second epitaxial source/drain regions 44 can be activated subsequently using a rapid thermal process.

During the selective epitaxial growth processes, the isolation structures 30 located at the opposite ends of the first gate structure (34A, 36A, 40A) obstructs the lateral growth of the first semiconductor material from extending past the ends of the first gate structure (34A, 36A, 40A) to ensure that merging of the first source/drain regions 42 does not occur beyond the ends of the first gate structure (34A, 36A, 40A). Likewise, the isolation structures 30 located at the opposite ends of the second gate structure (34B, 36B, 40B) obstructs the lateral growth of the second semiconductor material from extending past the ends of the second gate structure (34B, 36B, 40B) to ensure that merging of the second source/drain regions 44 does not occur beyond the ends of the second gate structure (34B, 36B, 40B). By blocking the lateral growth of the epitaxial semiconductor materials (e.g., the first semiconductor material and the second semiconductor material) from extending past the ends of the first gate structure (34A, 36A, 40A) and the second gate structure (34B, 36B, 40B), the isolation structures 30 prevent the electrical shorts between the source/drain regions 42, 44. Furthermore, the isolation structures 30 also obstruct the lateral growth of the first semiconductor material and the second semiconductor material from getting into contact with each other.

In the present application, because the ends of the gate structures (34A, 36A, 40A, 34B, 36B, 40B) are self-aligned with sidewalls of the isolation structures 30, the lateral distance between each end of the gate structures (34A, 36A, 40A, 34B, 36B, 40B) and a corresponding outermost sidewall of the semiconductor fins 16A, 16B can be made sufficiently small without causing the merging of source/drain regions 42, 44 at the ends of the gate electrode 36A, 36B. As a result, the area penalty and the additional capacitance between the gate electrode and source/drain regions caused by the large gate extension in the case of prior art can be reduced.

In one embodiment and when the gate stacks illustrated above are sacrificial gate stacks, after forming the epitaxial source/drain regions 42, 44, the sacrificial gate stacks are replaced with functional gate stacks to provide functional gate structures. The processes of forming such functional gate structures are illustrated and described in FIGS. 10-11. The sacrificial gate stacks includes first sacrificial stacks and second sacrificial stacks. Each first sacrificial gate stack comprises a first sacrificial gate dielectric 134A and a sacrificial gate material 136A and each second sacrificial gate stack comprises a second sacrificial gate dielectric 134B and a sacrificial gate material 136B.

Referring now to FIGS. 10A-10B, there is illustrated the exemplary semiconductor structure of FIGS. 9A-9B after forming interlevel dielectric layer (ILD) portions 46 over the epitaxial source/drain regions 42, 44. The ILD portions 46 can be formed by first depositing an ILD layer (not shown) over the isolation structures 30, the sacrificial gate stacks (134A, 136A, 134B, 136B), the gate spacers 40A, 40B and the epitaxial source/drain regions 42, 44. In some embodiments of the present application, the ILD layer may be composed a dielectric material that may be easily planarized. For example, the ILD layer can include a doped silicate glass, an undoped silicate glass (silicon oxide), an organosilicate glass (OSG), a porous dielectric material, or amorphous carbon. The ILD layer can be deposited using a conventional deposition process, such as, for example, CVD and PECVD. Following the deposition of the ILD layer, the ILD layer can be subsequently planarized, for example, by CMP using the topmost surfaces of the sacrificial gate stacks (134A, 136A, 134B, 136B) (i.e., top surfaces of the gate electrodes 136A, 136B) as an etch stop. Remaining portions of the ILD layer are herein referred to as ILD layer portions 46. After planarization, top surfaces of the ILD layer portions 46 are coplanar with the topmost surfaces of the sacrificial gate stacks (134A, 136A, 134B, 136B).

Figure 11A:
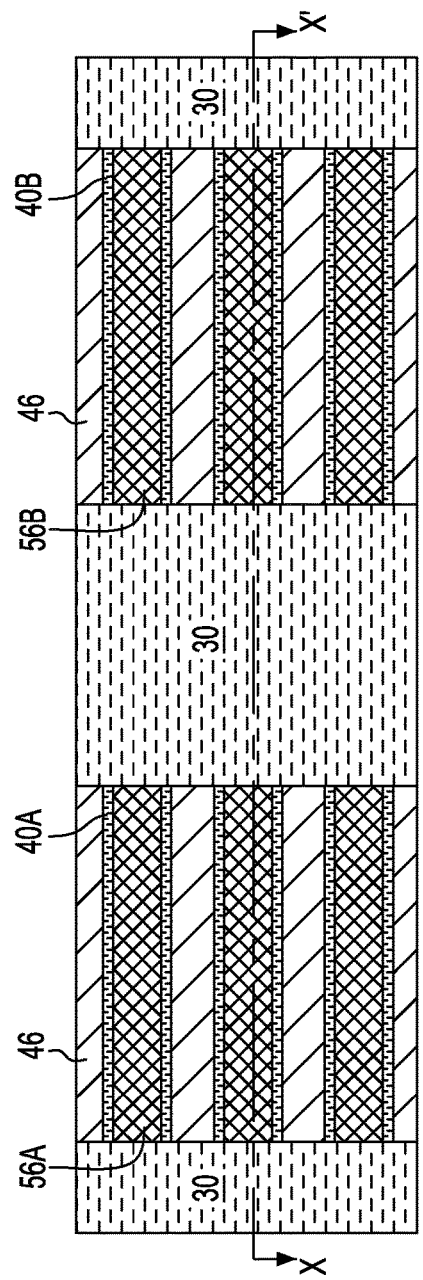
FIG. 11A is a top view of the exemplary semiconductor structure of FIG. 10A after forming first functional gate stacks and second functional gate stacks.
Figure 11B:
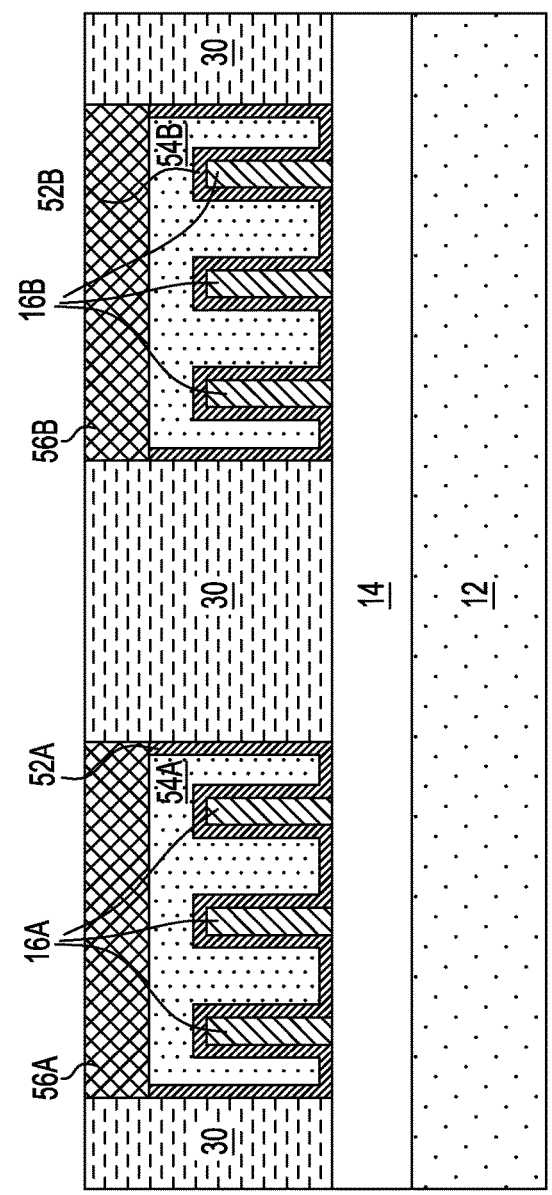
FIG. 11B is a cross-sectional view of the exemplary semiconductor structure of FIG. 10A along line X-X'.

Referring now to FIGS. 11A-11B, there is illustrated the exemplary semiconductor structure of FIGS. 10A-10B after forming first functional gate stacks and second functional gate stacks. The sacrificial gate stacks (134A, 136A, 134B, 136B) are first removed to provide first gate cavities and second gate cavities (not shown). Each first gate cavity occupies a volume from which a first sacrificial gate stack (134A, 136A) is removed and is laterally confined by inner sidewalls of the first gate spacers 40A. Each second gate cavity occupies a volume from which a sacrificial second gate stack (134B, 136B) is removed and is laterally confined by inner sidewalls of the second gate spacers 40B. The first sacrificial gate stacks (134A, 136A) and the second sacrificial gate stacks (134B, 136B) can be removed selectively to the semiconductor fins 16A, 16B, the gate spacers 40A, 40B, the isolation structures 30 and the ILD layer portions 46 by at least one etch. The at least one etch can be a wet chemical etch such as an ammonia etch or a dry etch such as RIE.

Subsequently, a first functional gate stack is formed in each first gate cavity and a second functional gate stack is formed in each second gate cavity. Each first functional gate stack includes a first gate dielectric 52A, a first gate electrode 54A and a first gate cap 56A. Each second functional gate stack includes a second gate dielectric 52B, a second gate electrode 54B and a second gate cap 56B. The first functional gate stacks (52A, 54A, 56A) and the second functional gate stacks (52B, 54B, 56B) can be formed by first depositing a gate dielectric layer (not shown) conformally on bottom surfaces and sidewalls of the first and the second gate cavities and on the top surfaces of the isolation structures 30. The gate dielectric layer may include a high-k dielectric material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

Remaining volumes of the first and the second gate cavities are then filled with a gate electrode layer (not shown). The gate electrode layer may comprise any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof.

Portions of the gate electrode layer formed above the top surfaces of the isolation structures 30 can be removed, for example, by CMP. Portions of the gate dielectric layer that is formed above the top surfaces of the isolation structures 30 may also be removed. In some embodiments and as illustrated in FIG. 8B, the remaining portions of the gate electrode layer and the remaining portions of the gate dielectric layer may be recessed utilizing a dry etch or a wet chemical etch to provide a void (not shown) in each gate cavity. A recessed portion of the gate dielectric layer in each first gate cavity constitutes the first gate dielectric 52A, and a recessed portion of the gate electrode layer in each first cavity constitutes the first gate electrode 54A. A recessed portion of the gate dielectric layer in each second gate cavity constitutes the second gate dielectric 52B, and a recessed portion of the gate electrode layer in each second cavity constitutes the second gate electrode 54B.

A gate cap layer is then deposited over the gate dielectric 52A, 52B and the gate electrode 54A, 54B in the gate cavities to fill voids that are formed after recessing the remaining portions of the gate electrode layer and the remaining portions of the gate dielectric layer. The gate cap layer may include a dielectric oxide, nitride or oxynitride. In one embodiment of the present application, the gate cap layer includes silicon nitride. The gate cap layer can be formed by a deposition process including, for example, CVD, PECVD, PVD or ALD. The gate cap layer that is formed can have a thickness ranging from 25 nm to 100 nm, although lesser or greater thicknesses can also be employed.

Following the deposition of the gate cap layer, the gate cap layer can be subsequently planarized, for example, by CMP to provide the first gate cap 56A in each first gate cavity and the second gate cap 56B in each second gate cavity.

First functional gate structures and second function gate structures are thus formed. Each first functional gate structure includes a first functional gate stack (52A, 54A, 56A) and a first gate spacer 40A located on each sidewall of the first functional gate stack (52A, 54A, 56A). Each second functional gate structure includes a second functional gate stack (52B, 54B, 56B) and a second gate spacer 40B located on each sidewall of the second functional gate stack (52B, 54B, 56B).

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of semiconductor fins located on a region of a substrate;
a gate structure overlying a channel portion of each of the plurality of semiconductor fins;
an epitaxial source region located on a first side of the gate structure, the epitaxial source region merging the plurality of semiconductor fins on the first side;
an epitaxial drain region located on a second side of the gate structure opposite to the first side, the epitaxial drain region merging the plurality of semiconductor fins on the second side; and
isolation structures located on the opposite ends of the gate structure, wherein a first isolation structure laterally contacts a first end of each of the gate structure, the epitaxial source region and the epitaxial drain region, and a second isolation structure laterally contacts a second end of each of the gate structure, the epitaxial source region and the epitaxial drain region opposite to the first end, wherein surfaces of a sidewall of the first isolation structure, the first end of the gate structure, the first end of the epitaxial source region and the first end of the epitaxial drain region are located within a same vertical plane, and surfaces of a sidewall of the second isolation structure, the second end of the gate structure, the second end of the epitaxial source region and the second end of the epitaxial drain region are located within a same another vertical plane.

2. The semiconductor structure of claim 1, wherein a lateral distance between a sidewall of each of the first isolation structure and the second isolation structure and a corresponding outermost sidewall of the plurality of semiconductor fins is from 5 nm to 40 nm.

3. The semiconductor structure of claim 1, wherein a lateral distance between opposite sidewalls of each of the first isolation structure and the second isolation structure is from 10 nm to 100 nm.

4. The semiconductor structure of claim 1, wherein each of the first isolation structure and the second isolation structure has a topmost surface coplanar with a topmost surface of the gate structure.

5. The semiconductor structure of claim 1, wherein each of the first isolation structure and the second isolation structure comprises a dielectric nitride.

6. The semiconductor structure of claim 1, wherein a portion of each of the first isolation structure and the second isolation structure abutting the gate structure has a height the same as a height of another portion of each of the first isolation structure and the second isolation structure abutting the epitaxial source region and epitaxial drain region.

7. The semiconductor structure of claim 1, wherein a portion of each of the first isolation structure and the second isolation structure abutting the gate structure has a height greater than a height of another portion of each of the first isolation structure and the second isolation structure abutting the epitaxial source region and epitaxial drain region.

8. The semiconductor structure of claim 1, further comprising an interlevel dielectric (ILD) layer portion located over the epitaxial source region and epitaxial drain region, wherein the ILD layer has a top surface coplanar with a topmost surface of the gate structure.

9. The semiconductor structure of claim 1, wherein the gate structure extends perpendicularly with respect to the plurality of semiconductor fins and has the first end and the second end extending parallel to the plurality of semiconductor fins.

10. The semiconductor structure of claim 1, wherein the gate structure comprises a gate stack and a gate spacer present on sidewalls of the gate stack.

11. The semiconductor structure of claim 10, wherein the first isolation structure and the second isolation structure laterally contacts opposite end walls of the gate stack and the gate spacer.

12. The semiconductor structure of claim 10, wherein the gate stack comprises a gate dielectric and a gate electrode.

13. The semiconductor structure of claim 12, wherein the gate dielectric is U-shaped.

14. The semiconductor structure of claim 1, wherein the epitaxial source region and epitaxial drain region comprise a same semiconductor material.

15. The semiconductor structure of claim 1, wherein the epitaxial source region and epitaxial drain region comprise different semiconductor materials.

16. The semiconductor structure of claim 15, wherein the epitaxial source region comprises Si:C, and the epitaxial drain region comprises SiGe.

17. The semiconductor structure of claim 1, wherein the substrate comprises a handle substrate and an insulator layer atop the handle substrate, wherein the plurality of semiconductor fins is in direct contact with the insulator layer.

18. The semiconductor structure of claim 1, further comprising:
a plurality of another semiconductor fins located on another region of the substrate;
another gate structure overlying a channel portion of each of the plurality of another semiconductor fins,
another epitaxial source region located on a first side of the another gate structure, the another epitaxial source region merging the plurality of another semiconductor fins; and
another epitaxial drain region located on a second side of the another gate structure opposite the first side, the another epitaxial drain region merging the plurality of another semiconductor fins on the second side,
wherein the second isolation structure separates the another gate structure, the another epitaxial source region and the another epitaxial drain region from the gate structure, the epitaxial source region and the epitaxial drain region, the second isolation structure laterally contacting an end of each of the another gate structure, the another epitaxial source region and the another epitaxial drain region.

* * * * *